(12) United States Patent
Takano et al.

(10) Patent No.: US 7,652,214 B2
(45) Date of Patent: Jan. 26, 2010

(54) ELECTRONIC COMPONENT PACKAGE

(75) Inventors: Atsushi Takano, Osaka (JP); Mitsuhiro Furukawa, Osaka (JP); Ryouichi Takayama, Hyogo (JP)

(73) Assignee: Panasonic Corporation, Osaka (JP)

( * ) Notice: Subject to any disclaimer, the term of this patent is extended or adjusted under 35 U.S.C. 154(b) by 71 days.

(21) Appl. No.: 11/575,809

(22) PCT Filed: Oct. 30, 2006

(86) PCT No.: PCT/JP2006/021638
§ 371 (c)(1),
(2), (4) Date: Mar. 22, 2007

(87) PCT Pub. No.: WO2007/052597
PCT Pub. Date: May 10, 2007

(65) Prior Publication Data
US 2009/0194325 A1 Aug. 6, 2009

(30) Foreign Application Priority Data

Nov. 2, 2005 (JP) ............................. 2005-319059
Dec. 19, 2005 (JP) ............................. 2005-364597
Feb. 7, 2006 (JP) ............................. 2006-029370

(51) Int. Cl.
*H01L 23/48* (2006.01)
(52) U.S. Cl. ...................... 174/534; 174/521; 257/788; 257/690
(58) Field of Classification Search ................. 174/521, 174/527, 534; 257/787, 788, 690, 693
See application file for complete search history.

(56) References Cited

U.S. PATENT DOCUMENTS

| 7,566,633 | B2 * | 7/2009 | Koyama et al. | 438/458 |
| 2005/0224974 | A1 * | 10/2005 | Nishida et al. | 257/737 |
| 2006/0053607 | A1 * | 3/2006 | Onozawa | 29/25.35 |
| 2007/0182028 | A1 * | 8/2007 | Takano | 257/787 |

FOREIGN PATENT DOCUMENTS

| JP | 08-204497 A | 8/1996 |
| JP | 2000-261284 A | 9/2000 |
| JP | 2001-244785 A | 9/2001 |
| JP | 2002-217673 A | 8/2002 |
| JP | 2003-032075 A | 1/2003 |
| JP | 2003-110391 A | 4/2003 |
| JP | 2005-285864 A | 10/2005 |
| JP | 2005-318157 A | 11/2005 |

OTHER PUBLICATIONS

Japanese Search Report for Application No. PCT/JP2006/321638 dated Jan. 23, 2007.
English translation of Form PCT/ISA/210.

* cited by examiner

*Primary Examiner*—Hung V Ngo
(74) *Attorney, Agent, or Firm*—RatnerPrestia

(57) ABSTRACT

In an electronic component package in which an electronic component mounted on a mounting substrate via external electrodes placed on the mounting substrate is covered by a mold resin, the electronic component has a component cover which covers elements placed on the lower face of a component substrate, and which forms cavities, and a protective member which is lower in elastic modulus than the mold resin is disposed in a portion which excludes portions joined with the external electrodes in a lower face of the component cover, and which is opposed to the cavities.

5 Claims, 12 Drawing Sheets

ELECTRONIC COMPONENT PACKAGE

TECHNICAL FIELD

The present invention relates to an electronic component package.

BACKGROUND ART

As shown in a sectional view of FIG. 19, a package of a surface acoustic wave (hereinafter, referred to as "SAW") device which is an example of a conventional electronic component package has: component substrate 101; IDT (Interdigital Transducer) electrodes 102 which are elements formed on the lower face (the face that is in the lower side in FIG. 19, and that is opposed to mounting substrate 105 which will be described later) of component substrate 101; component cover 104 having recesses 103 in portions which are opposed to IDT electrodes 102; and external electrodes 106 which join component cover 104 with mounting substrate 105. As prior art technique document information relating to such a conventional electronic component package, Japanese Patent Unexamined Publications Nos. 2000-261284, 2001-244785, 2003-110391, 2005-318157, and the like are known.

However, a conventional electronic component package cannot sometimes withstand a pressure shock in a mold resin process.

In component cover 104, in order to prevent component cover 104 from being in contact with plural IDT electrodes 102, recesses 103 are disposed, and, in the portions where recesses 103 exist, component cover 104 is very thin. In the case where the SAW device is mounted on mounting substrate 105 and covered by a mold resin, because the pressure of the mold resin entering between the component cover 104 and mounting substrate 105 is very high, therefore, component cover 104 is damaged.

DISCLOSURE OF THE INVENTION

It is an object of the invention to enhance the strength of an electronic component package against an external pressure, thereby preventing the package from being damaged.

According to the invention, in an electronic component package in which an electronic component mounted on a mounting substrate via external electrodes placed on the mounting substrate is covered by a mold resin, therefore, the electronic component has a component cover which covers elements placed on a lower face (a face on a side opposed to the mounting substrate) of a component substrate, and which forms cavities, and a protective member which is lower in elastic modulus than the mold resin is disposed in a portion which excludes portions joined with the external electrodes in a lower face (a face on a side opposed to the mounting substrate) of the component cover, and which is opposed to the cavities.

The electronic component package of the invention includes: the mounting substrate; the external electrodes placed on the mounting substrate; the electronic component mounted on the mounting substrate via the external electrodes; and the mold resin which covers the electronic component on the mounting substrate, the electronic component has: the component substrate; the elements which are placed on the face of the component substrate opposed to the mounting substrate; and the component cover which covers the side of the face of the component substrate opposed to the mounting substrate, the component cover has the cavities in the portions which are opposed to the elements, and the protective member which is lower in elastic modulus than the mold resin is disposed in a face of the component cover opposed to the mounting substrate, the face excluding portions joined with the external electrodes, and being opposed to the cavities.

According to the configuration, even when recesses are disposed in the component cover and the thickness is reduced, because the protective member which is lower in elastic modulus than the mold resin is disposed on the lower face of the component cover, the protective member which receives a pressure that is applied from the lower side during a mold resin filling process can elastically deform so as to laterally disperse the pressure. Therefore, it is possible to buffer a stress which is externally applied to the electronic component.

As a result of the above, the invention can enhance the strength of an electronic component package against a pressure, thereby preventing the package from being damaged.

DESCRIPTION OF REFERENCE NUMERALS AND SIGNS

Figure 1:
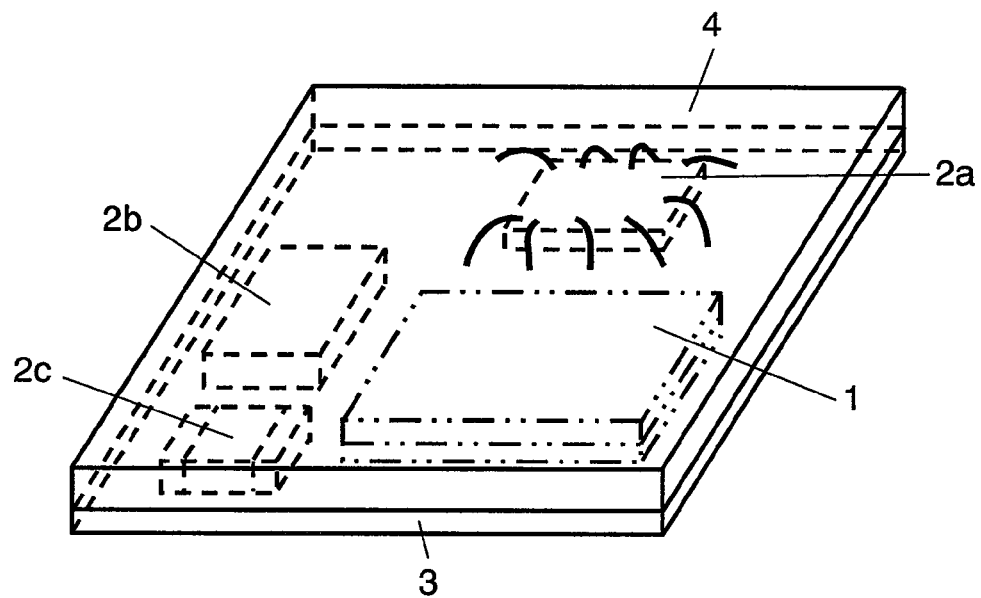
FIG. 1 is a perspective view of an electronic component package of Embodiment 1.

1 SAW duplexer (electronic component)
3 mounting substrate
4 mold resin
5 external electrode
6 component substrate
7 IDT electrode (element)
8 recess
9 component cover
10 protective member
16 cavity
20 element cover
30 bonding portion

PREFERRED EMBODIMENTS FOR CARRYING OUT THE INVENTION

Embodiment 1

An electronic component package of Embodiment 1 of the invention will be described with exemplifying acoustic wave device 1 for an antenna duplexer (hereinafter, referred to as "SAW duplexer 1") as an electronic component.

As shown in a perspective view of FIG. 1, SAW duplexer 1 constituting the electronic component package is placed together with other electronic components 2a to 2c on mounting substrate 3, and covered by mold resin 4. As shown in a sectional view of FIG. 2, SAW duplexer 1 is mounted on mounting substrate 3 via external electrodes 5 which are placed on mounting substrate 3, and covered by mold resin 4.

SAW duplexer 1 includes: component substrate 6; IDT electrodes 7 which are plural elements placed on the lower face (the face that is in the lower side in FIG. 2, and that is opposed to mounting substrate 3, and the same shall apply hereinafter) of component substrate 6; and component cover 9 which covers the lower face side of component substrate 6, and which has recesses 8 in portions opposed to IDT electrodes 7. Resin-made protective member 10 is disposed on the lower face of component cover 9. External electrodes 5 indicate electrodes which are to be joined with ground terminal 12, reception terminal 13, antenna terminal 14, and transmission terminal 15 of SAW duplexer 1 shown in FIG. 8, and which are disposed on mounting substrate 3, and will be described later in detail.

Hereinafter, a method of producing the electronic component package will be described.

Figure 3:
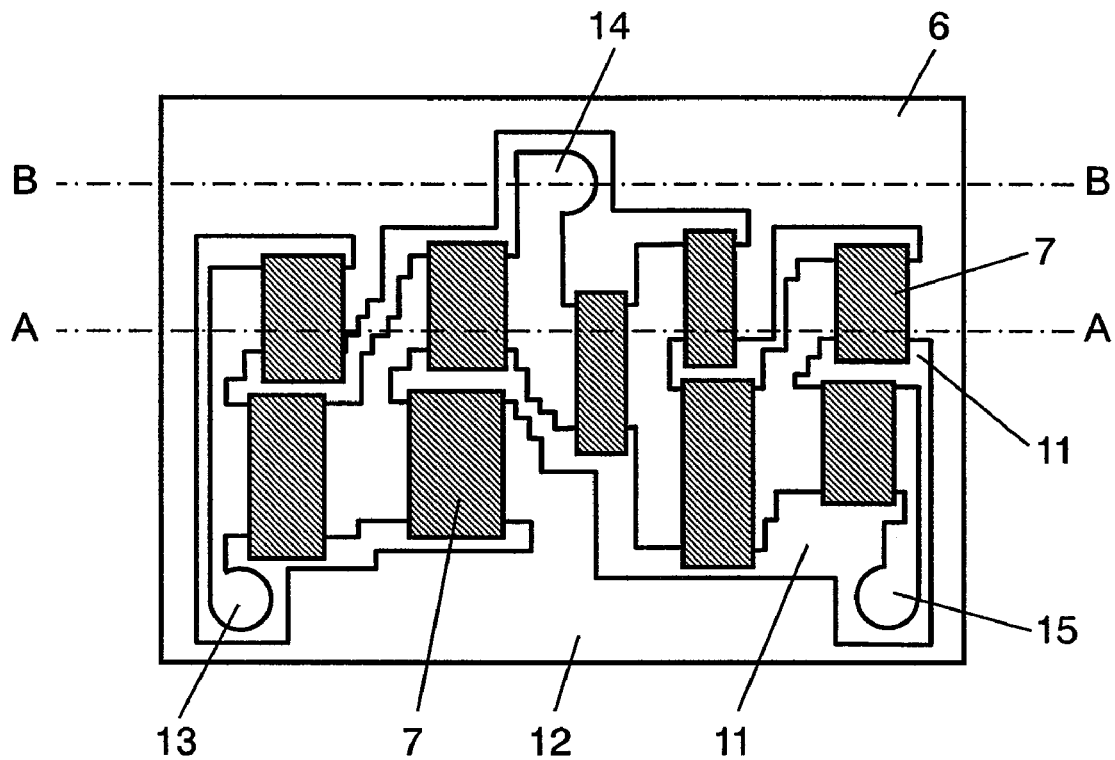
FIG. 3 is a bottom view of a component substrate constituting the electronic component package of Embodiment 1.
Figure 4:
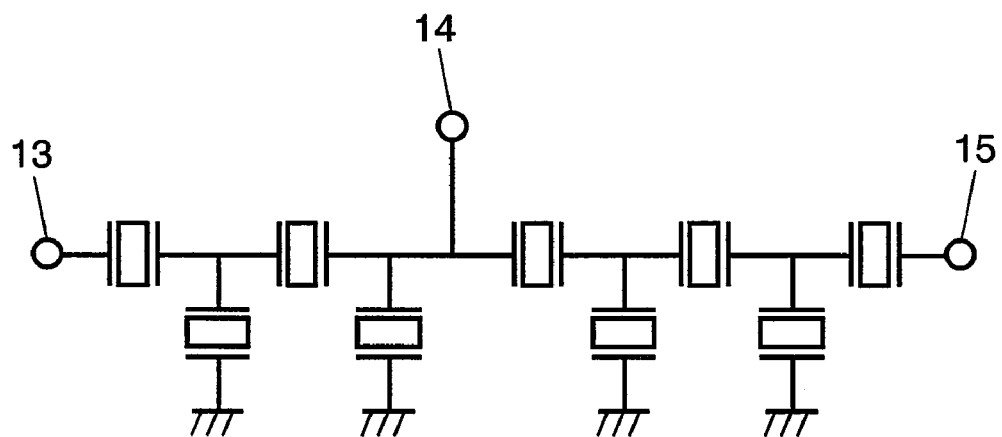
FIG. 4 is a circuit diagram of a SAW duplexer constituting the electronic component package of Embodiment 1.

First, as shown in FIG. 3, IDT electrodes 7 and groove 11 are formed on the lower face of component substrate 6, and a circuit of SAW duplexer 1 shown in FIG. 4 is formed. Although reflectors in which short-circuit electrodes are placed in parallel are usually placed in the both ends of IDT electrodes 7, the reflectors are omitted. Groove 11 is formed by a dry etching process. As the material of component substrate 6, $LiTaO_3$ or $LiNbO_3$ is used, and, as that of IDT electrodes 7, a metal material such as aluminum is used. Reception terminal 13, antenna terminal 14, transmission terminal 15, and ground terminal 12 of SAW duplexer 1 shown in FIG. 4 correspond to reception terminal 13, antenna terminal 14, transmission terminal 15, and ground terminal 12 on the lower face of component substrate 6 shown in FIG. 3, respectively.

Figure 2:
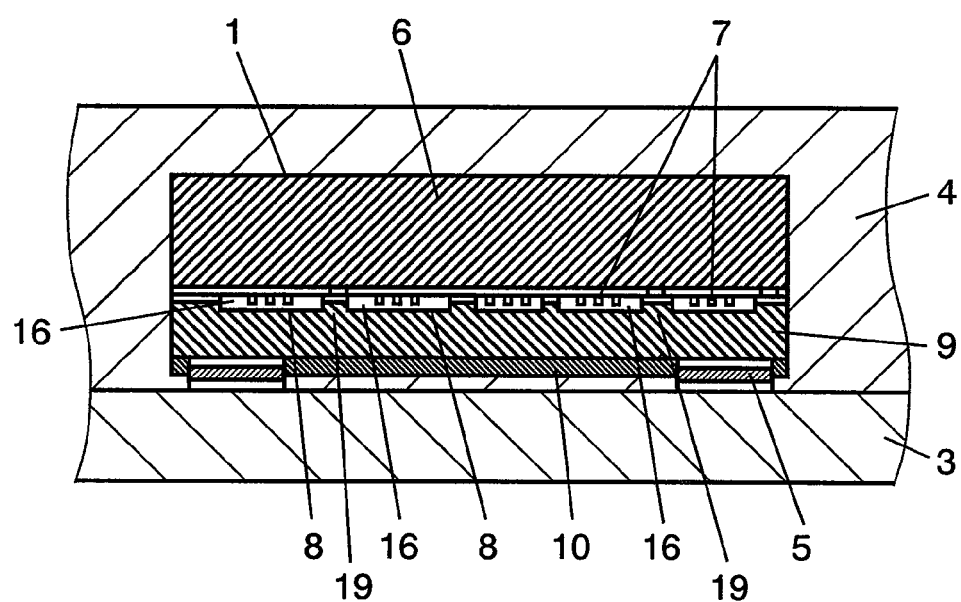
FIG. 2 is a sectional view of the electronic component package of Embodiment 1.

By contrast, in order to protect IDT electrodes 7 from corrosion due to oxidation or moisture, component cover 9 made of silicon is disposed on the side of the lower face of component substrate 6 as shown in FIG. 2. FIG. 2 shows a section taken along A-A in FIG. 3.

Figure 5:
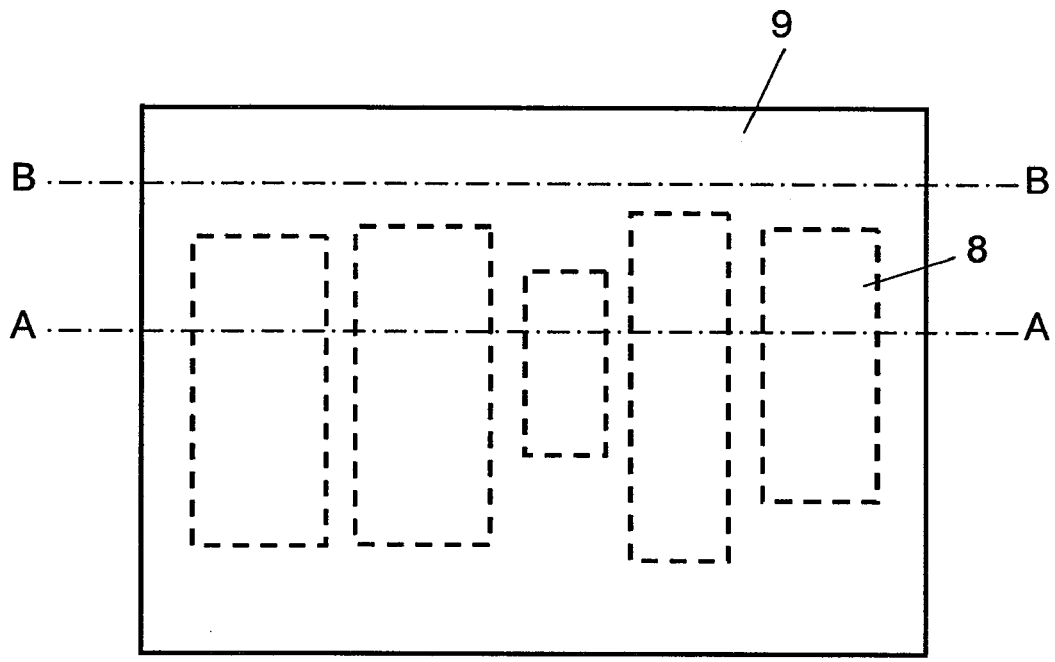
FIG. 5 is a bottom view of a component cover constituting the electronic component package of Embodiment 1.

In component cover 9, as shown in FIG. 5, recesses 8 are formed by a dry etching process in portions opposed to IDT electrodes 7 which are described above. As shown in FIG. 2, accordingly, cavities 16 for preventing IDT electrodes 7 from contacting with component cover 9 can be formed between component cover 9 and IDT electrodes 7, and vibration spaces for IDT electrodes 7 can be ensured. As shown in FIGS. 2 and 5, each of cavities 16 is disposed for one or two adjacent IDT electrodes 7, whereby the area of portions where component cover 9 is thinned can be reduced. As a result, the strength against an external pressure is enhanced.

Next, a step of bonding component cover 9 to component substrate 6 will be shown.

Figure 6:
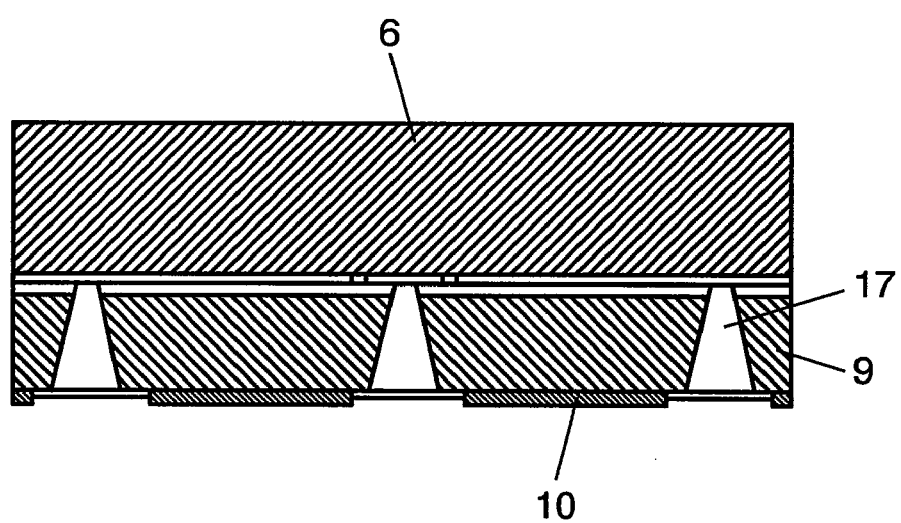
FIG. 6 is a sectional view of the SAW duplexer of Embodiment 1.
Figure 7:
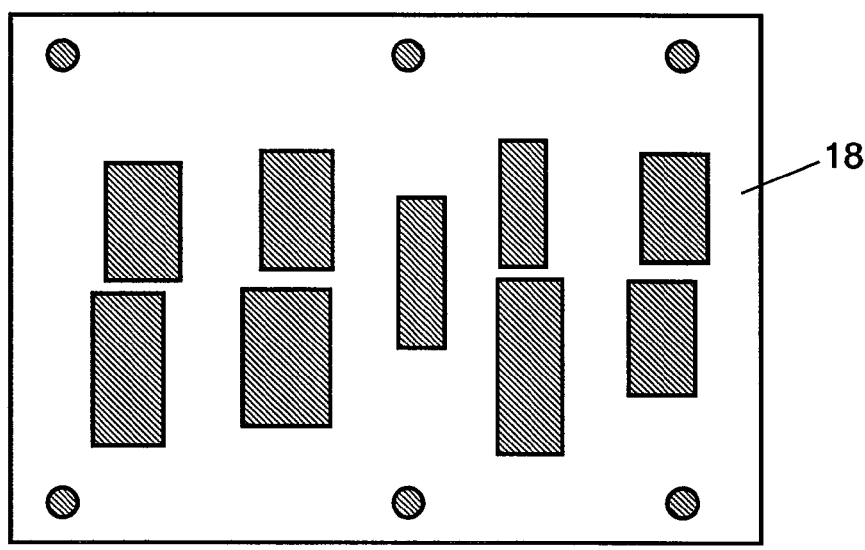
FIG. 7 is a top view of a mask for forming the component cover in Embodiment 1.

First, a photosensitive resin is applied to the side of the lower face (this is also the face where IDT electrodes 7 are disposed) of component substrate 6 shown in FIG. 3, and then mask 18 shown in FIG. 7 is placed. The hatched portions in mask 18 of FIG. 7 are portions corresponding to IDT electrodes 7 of FIG. 3 and through holes 17 of FIG. 6, and holes are opened in the portions. When exposure is performed from the upper side of mask 18, and washing is conducted, therefore, the photosensitive resin is hardened to remain only in the hatched portions on mask 18, and does not remain in unhatched portions.

Next, mask 18 is removed away, $SiO_2$ is applied to the entire lower face of component substrate 6 shown in FIG. 3, and the photosensitive resin is dissolved and removed away, thereby allowing $SiO_2$ to remain only on a portion where the photosensitive resin does not exist, i.e., a portion other than IDT electrodes 7 and through holes 17. Component substrate 6 and component cover 9 are directly interatomically bonded together at ordinary temperature through remaining $SiO_2$, with the result that SAW duplexer 1 shown in FIG. 6 can be formed. In Embodiment 1, the step of bonding component cover 9 is performed in a vacuum. Alternatively, component cover 9 and component substrate 6 are bonded together by using an adhesive agent. In this case, the step can be performed in a nitrogen atmosphere or in an oxygen atmosphere. In the case of an oxygen atmosphere, since cavities 16 of FIG. 2 in Embodiment 1 are very small spaces, and hence the amount of oxygen in cavities 16 is very small. In the amount of oxygen of this degree, only a thin metal oxide film is formed in the surfaces of IDT electrodes 7, or rather oxidation hardly occurs.

Next, as shown in FIG. 6, through holes 17 for connecting external electrodes 5 shown in FIG. 2 with component substrate 6 are formed in component cover 9. Through holes 17 can be formed by a dry etching process. FIG. 6 shows a section taken along B-B in FIG. 3. Through holes 17 are filled with a metal material by sputtering, solder paste printing, or the like, whereby the electrical connection between the IDT electrodes and the external electrodes is attained.

Figure 8:
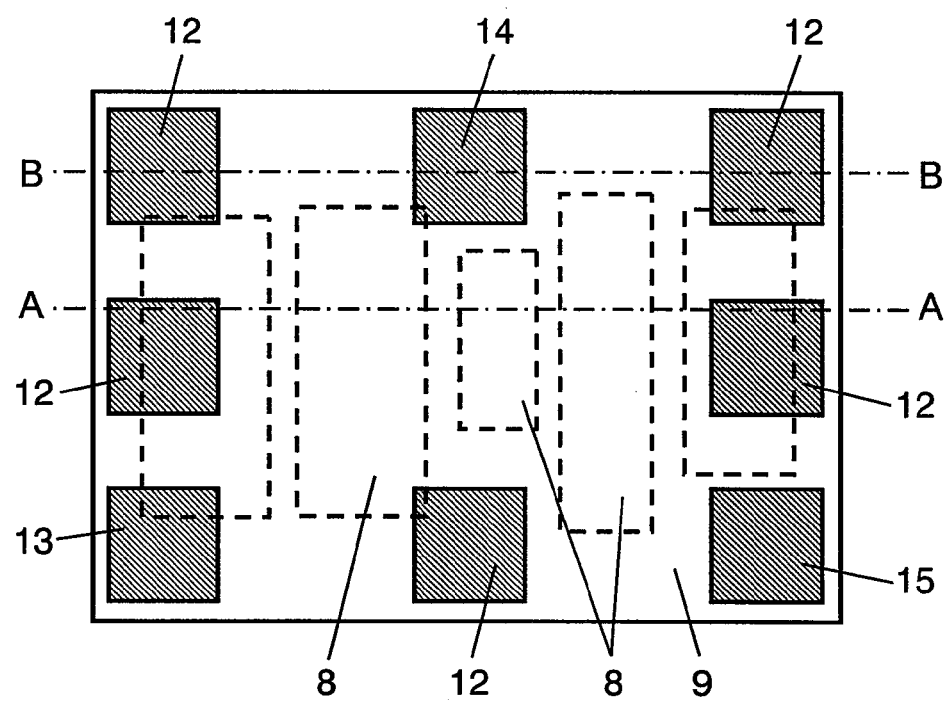
FIG. 8 is a bottom view of the component cover in Embodiment 1.

Next, resin-made protective member 10 shown in FIG. 2 is disposed on an unhatched portion of FIG. 8, namely on a portion excluding places where reception terminal 13, antenna terminal 14, transmission terminal 15, and ground terminal 12 which are to be joined with external electrodes 5, and which are disposed on the lower face of component cover 9 are placed. Protective member 10 is formed by performing printing or the like of a rubber modified flexible resin in which rubber such as silicone rubber is added to an epoxy resin or a polyimide resin.

After component substrate 6 and component cover 9 are bonded together, as shown in FIG. 8, ground terminal 12, reception terminal 13, antenna terminal 14, and transmission terminal 15 which are disposed on the lower face of component cover 9 are joined with external electrodes 5 of mounting substrate 3 as shown in FIG. 2, and SAW duplexer 1 is mounted on mounting substrate 3.

Finally, a step of covering SAW duplexer 1 with mold resin 4 will be described.

First, a complex electronic component in which SAW duplexer 1 and plural electronic components 2a to 2c of FIG. 1 are mounted, and which has not been covered is placed in molds. Next, heated mold resin 4 is injected into the molds, and then cooled to be molded. In Embodiment 1, an epoxy resin in which a filler is dispersed was used as mold resin 4, and injection conditions of mold resin 4 were set so that the resin temperature is 175° C. and the injection pressure is 50 to 100 atm.

When the space between component cover 9 and mounting substrate 3 is filled with mold resin 4, a pressure which is very large, and which is upward directed (in the upward direction in FIG. 2) is applied to component cover 9. Since resin-made protective member 10 disposed on the lower face of component cover 9 shown in FIG. 2 is lower in elastic modulus than mold resin 4, however, the protective member is deformed when receiving the pressure from mold resin 4, to laterally disperse the pressure. Therefore, it is possible to buffer a stress which is applied to SAW duplexer 1 from the lower side of the component package.

Since protective member 10 is disposed, the space between SAW duplexer 1 and mounting substrate 3 is made small, and the amount of mold resin 4 entering the space can be reduced. Therefore, a stress from mold resin 4 can be suppressed.

As a result of the above, according to Embodiment 1, the strength of the package of SAW duplexer 1 against a pressure can be enhanced, thereby preventing the package from being damaged.

In Embodiment 1, as described above, the protective member is disposed on the unhatched portion of FIG. 8, namely on all portions excluding the portions joined with external electrodes 5 in the lower face of component cover 9 (the places where ground terminal 12, reception terminal 13, antenna terminal 14, and transmission terminal 15 are placed). Alternatively, the protective member may be disposed on a partial portion excluding at least portions joined with external electrodes 5, and opposed to cavities 16, whereby the same function and effect as described above can be obtained.

In Embodiment 1, as shown in FIG. 3, plural IDT electrodes 7 are formed on component substrate 6, and, as shown in FIG. 5, each recess is disposed for one or two IDT electrodes 7. When plural recesses 8 are formed in this way, damage of SAW duplexer 1 can be effectively suppressed as compared with the case where one recess 8 is disposed so as to cover all IDT electrodes 7.

Namely, when plural recesses 8 are formed, cavities 16 are partitioned, and partition walls 19 shown in FIG. 2 are formed between plural cavities 16. Partition walls 19 function as struts, and it is possible to disperse an external stress. Therefore, breakage of component substrate 6 or component cover 9 can be suppressed. Partition walls 19 may be separately formed in an arbitral manner in cavities 16 by a resin or the like.

Plural cavities 16 may be formed completely separately, or alternatively adjacent cavities 16 may be partly coupled to each other by a tunnel-like communication path (not particularly shown). In the case where communication paths are disposed in this way, when an excess external pressure is applied to a part of cavities 16, the external pressure can be dispersed to other cavities 16 through communication paths. As a result, the strength of the electronic component package against an external pressure can be improved.

The communication paths may be disposed on component substrate 6, or on component cover 9. In the case where the communication paths are disposed on component substrate 6, groove 11 in the lower face of component substrate 6 shown in FIG. 4 may be used as the communication paths.

Embodiment 2

Hereinafter, Embodiment 2 of the invention will be described with reference to the figures.

Embodiment 2 is mainly different from above-described Embodiment 1 in that, in order to form cavities 16, element covers 20 which cover the lower portions of IDT electrodes 7 (the lower portions in FIG. 9, and the side opposed to mounting substrate 3, the same shall apply hereinafter), and which function as elements are used. The other similar configurations are described with using the same reference numerals, and their description is simplified.

Also in the electronic component package of Embodiment 2, as shown in FIG. 1, it is structured so that SAW duplexer 1 is mounted together with other electronic components 2a to 2c on mounting substrate 3, and covered by mold resin 4.

Figure 9:
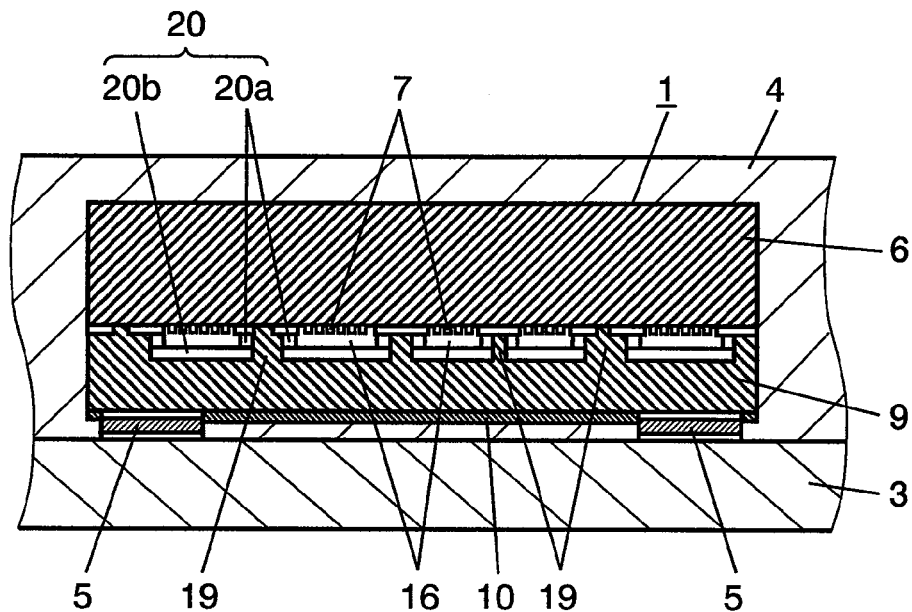
FIG. 9 is a sectional view of an electronic component package of Embodiment 2.

As shown in a sectional view of FIG. 9, SAW duplexer 1 constituting the electronic component package has a structure including: component substrate 6; IDT electrodes 7 which are plural elements placed on the lower face of component substrate 6; element covers 20 which cover the lower face sides of IDT electrodes 7; component cover 9 which covers the entire lower face of component substrate 6 including element covers 20; and resin-made protective member 10 which is disposed on the lower face of component cover 9. In the same manner as above-described Embodiment 1, external electrodes 5 indicate electrodes which are to be joined with ground terminal 12, reception terminal 13, antenna terminal 14, and transmission terminal 15 of SAW duplexer 1 shown in FIG. 8, and which are disposed on mounting substrate 3.

Cavities 16 are formed between IDT electrodes 7 and element covers 20, whereby vibration spaces for an acoustic wave is ensured, and the vibration spaces are maintained to an airtight state. In Embodiment 2, each of element covers 20 is disposed for one or two IDT electrodes 7.

As the material of component substrate 6, $LiTaO_3$ was used, as that of the IDT electrodes, aluminum was used, and, as that of component cover 9, an epoxy resin containing a filler was used. As the filler, silicon oxide was used, and its content rate was about 80 wt %. As frame portions 20a of element covers 20, a photosensitive polyimide was used, and, as cover portions 20b of element covers 20, a three-layer structured photosensitive dry film in which a photosensitive layer is sandwiched between polyester and polyethylene was used. Also $LiNbO_3$ may be used as the material of component substrate 6, and a metal other than aluminum may be used as that of IDT electrodes 7.

Hereinafter, a method of producing SAW duplexer 1 of Embodiment 2 will be described.

Figure 10:
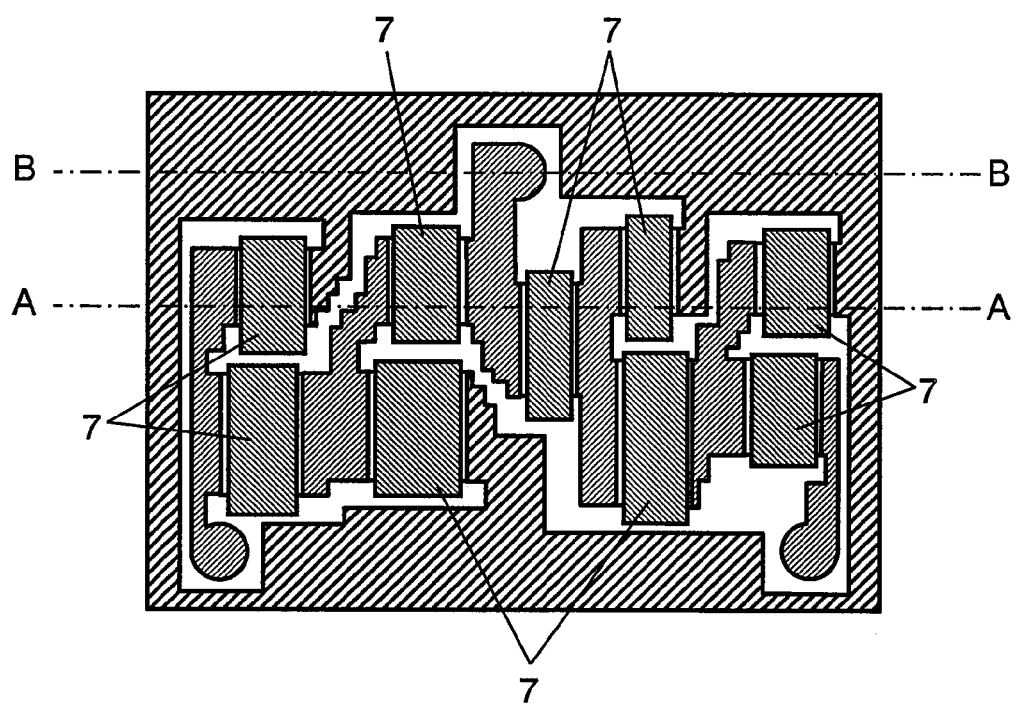
FIG. 10 is a bottom view of a component substrate constituting the electronic component package of Embodiment 2.
Figure 11A:
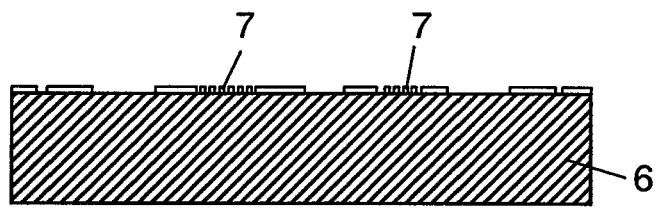
FIG. 11A is a first view showing a production step of a SAW duplexer in Embodiment 2.

First, as shown in FIG. 10, aluminum is sputter deposited on the entire lower face of component substrate 6, and then, as shown in FIG. 11A, an electrode pattern for IDT electrodes 7 and the like is formed by a dry etching process.

FIGS. 11A to 11F and subsequent FIGS. 12A to 12F are views showing a production step of SAW duplexer 1, and hence show a state in which SAW duplexer 1 of FIGS. 1 and 2 and other figures showing the mounted state of SAW duplexer 1 is vertically inverted. Only in the description with reference to FIGS. 11A to 11F and FIGS. 12A to 12F, therefore, the vertical direction is inverted to that in the other description.

Figure 11B:
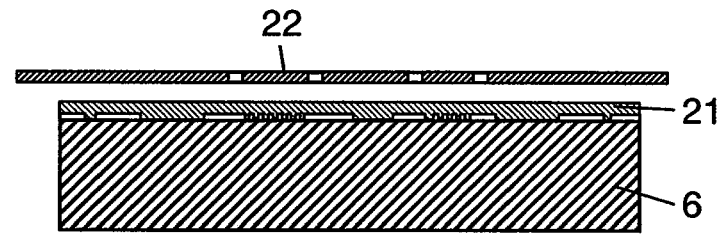
FIG. 11B is a second view showing the production step of the SAW duplexer in Embodiment 2.
Figure 11C:
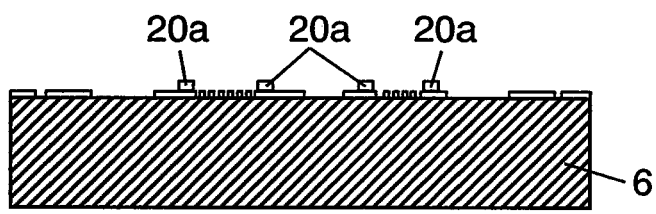
FIG. 11C is a third view showing the production step of the SAW duplexer in Embodiment 2.
Figure 11D:
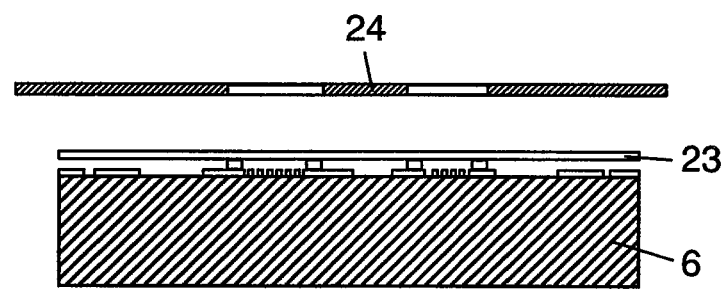
FIG. 11D is a fourth view showing the production step of the SAW duplexer in Embodiment 2.
Figure 11E:
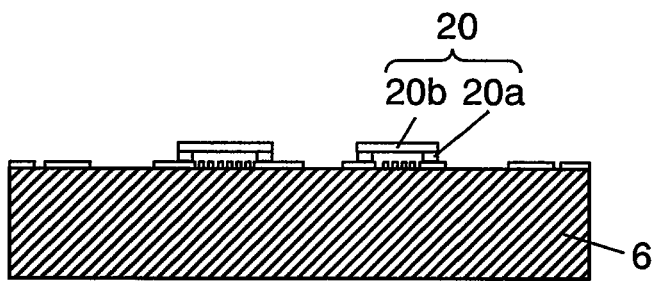
FIG. 11E is a fifth view showing the production step of the SAW duplexer in Embodiment 2.

Next, as shown in FIG. 11B, a photosensitive polyimide layer 21 is applied by spin coating on component substrate 6, mask 22 in which light can pass through portions corresponding to frame portions 20a of element covers 20 is placed above the layer, and exposure and development are performed. As a result, frame portions 20a of element covers 20 can be formed as shown in FIG. 11C. Thereafter, as shown in FIG. 11D, photosensitive dry film 23 is placed above component substrate 6 via frame portions 20a, mask 24 in which light can pass through portions corresponding to cover portions 20b of element covers 20 is placed above photosensitive dry film 23, and exposure and development are performed. As a result, element covers 20 configured by frame portions 20a and cover portions 20b are formed as shown in FIG. 11E.

Figure 11F:
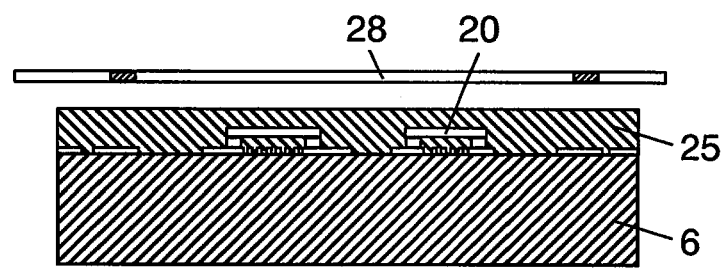
FIG. 11F is a sixth view showing the production step of the SAW duplexer in Embodiment 2.
Figure 12A:
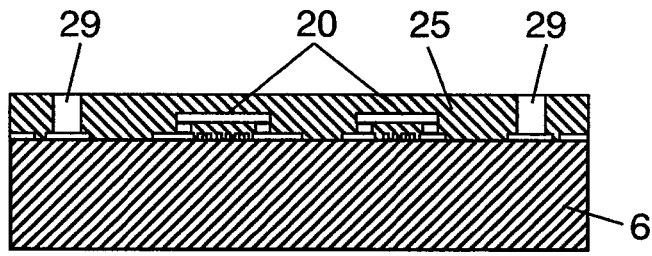
FIG. 12A is a seventh view showing the production step of the SAW duplexer in Embodiment 2.

Next, as shown in FIG. 11F, photosensitive resist (negative type) 25 is applied onto component substrate 6 so as to cover element covers 20, and the upper side of photosensitive resist 25 is masked by mask 28 so that portions corresponding to external terminal connecting portions 26 (shown in FIG. 12B) which will be described later are not exposed. Then, exposure and development are performed. As shown in FIG. 12A, holes 29 can be disposed in the portions of photosensitive resist 25 corresponding to external terminal connecting portions 26.

Figure 12B:
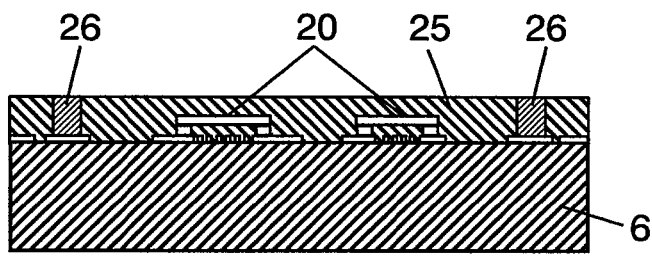
FIG. 12B is an eighth view showing the production step of the SAW duplexer in Embodiment 2.
Figure 12C:
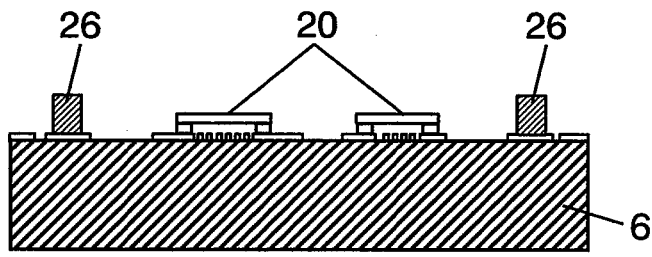
FIG. 12C is a ninth view showing the production step of the SAW duplexer in Embodiment 2.
Figure 12D:
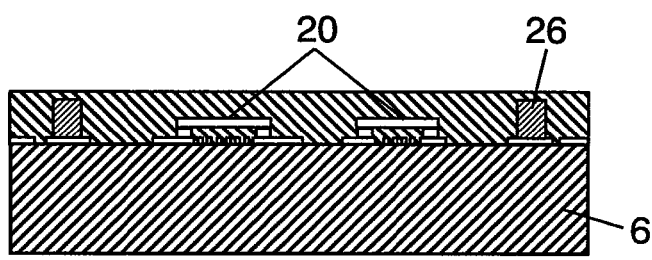
FIG. 12D is a tenth view showing the production step of the SAW duplexer in Embodiment 2.

Next, as shown in FIG. 12B, holes 29 are filled with Cu by electroless plating to form external terminal connecting portions 26. Thereafter, as shown in FIG. 12C, photosensitive resist 25 is dissolved, and component substrate 6 is placed in the molds. Then, as shown in FIG. 12D, a liquid epoxy resin (which will be formed as component cover 9) is poured onto component substrate 6 so as to cover element covers 20 and external terminal connecting portions 26, and heat cured.

Figure 12E:
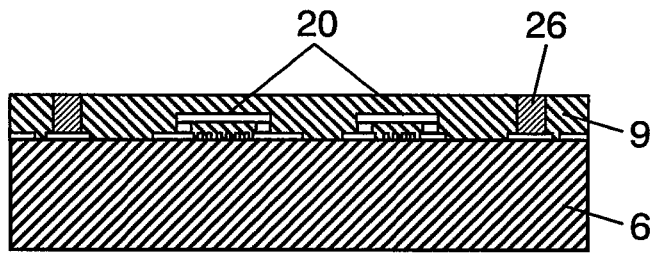
FIG. 12E is an eleventh view showing the production step of the SAW duplexer in Embodiment 2.
Figure 12F:
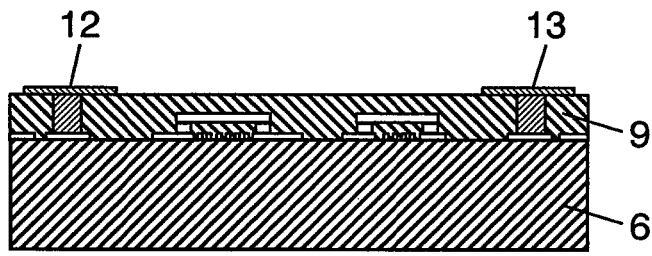
FIG. 12F is a twelfth view showing the production step of the SAW duplexer in Embodiment 2.

Next, as shown in FIG. 12E, the epoxy resin forming component cover 9 is polished until external terminal connecting portions 26 are exposed, thereby forming component cover 9. Then, as shown in FIG. 12F, the electrodes (ground terminal 12, reception terminal 13, antenna terminal 14, and transmission terminal 15, and, however, only ground terminal 12 and reception terminal 13 are shown, and antenna terminal 14 and transmission terminal 15 are not shown in the figure) to be joined with external electrodes 5 are placed on external terminal connecting portions 26, thereby completing SAW duplexer 1.

Next, as shown in FIG. 9 (as described above, FIGS. 9, 11A to 11F, and 12A to 12F are vertically inverted), resin-made protective member 10 is disposed on a face excluding places where the electrodes (ground terminal 12, reception terminal 13, antenna terminal 14, and transmission terminal 15) to be joined with external electrodes 5 on the lower face of component cover 9 are placed. Preferably, protective member 10 is disposed so as to be opposed to cavities 16. Protective member 10 is formed by performing printing or the like of a rubber modified flexible resin in which rubber such as silicone rubber is added to an epoxy resin or a polyimide resin.

Finally, a step of covering SAW duplexer 1 mounted on mounting substrate 3 with mold resin 4 to package the duplexer will be described.

First, a complex electronic component in which SAW duplexer 1 and other electronic components 2a to 2c such as shown in FIG. 1 are mounted is placed in molds. Next, heated and pressurized mold resin 4 is injected into the molds, and then cooled to be formed. In Embodiment 2, an epoxy resin in which a filler is dispersed was used as mold resin 4, and injection conditions of mold resin 4 were set so that the resin temperature is 175° C. and the injection pressure is 50 to 100 atm. As the filler of mold resin 4, silicon oxide was used, and its mixing rate was about 80 to 90 wt %.

According to the configuration, the strength of the electronic component package against an external pressure in the process using mold resin 4 is enhanced, and the electronic component can be prevented from being damaged. The reason of this phenomenon will be described.

When the space between component cover 9 and mounting substrate 3 is filled with mold resin 4 as shown in FIG. 9, a pressure which is very large, and which is upward directed is applied to component cover 9. Since resin-made protective member 10 is lower in elastic modulus than mold resin 4, i.e., soft, however, the protective member is deformed when receiving the pressure from mold resin 4, to disperse the pressure in many directions. Therefore, protective member 10 can buffer a stress which is applied to SAW duplexer 1 from the lower side of component cover 9 and element covers 20.

Since protective member 10 is disposed, the space between SAW duplexer 1 and mounting substrate 3 is made small, and the amount of mold resin 4 entering the space can be reduced. Therefore, a stress from mold resin 4 can be suppressed.

In Embodiment 2, as described above, protective member 10 is disposed on the unhatched portion of FIG. 8, namely on all portions excluding the portions joined with external electrodes 5 in the lower face of component cover 9 (i.e., the places where ground terminal 12, reception terminal 13, antenna terminal 14, and transmission terminal 15 are placed). Alternatively, the protective member may be disposed on a partial portion excluding at least portions joined with external electrodes 5, and opposed to cavities 16, whereby the same function and effect as described above can be obtained.

Since component cover 9 is made of an epoxy resin containing a filler, damage of the electronic component can be suppressed, and the reliability against an external pressure can be improved.

As a result, when an external pressure is applied to the electronic component, on the one hand, component cover 9 is allowed to be elastically deformed to some extent by the resin portion, so that the external pressure can be dispersed in many directions. On the other hand, the external shape of component cover 9 can be maintained by the filler portion, so that excess elastic deformation can be suppressed. As a result, the strength of the electronic component package against an external pressure can be enhanced, whereby damage of IDT electrodes 7 can be reduced.

Since component cover 9 contains the filler, component cover 9 exhibits higher hydrophobicity than the case where the component cover is made of only a resin, whereby IDT electrodes 7 can be suppressed from corrosion due to moisture.

In Embodiment 2, plural IDT electrodes 7 are formed on component substrate 6, and each of element covers 20 is disposed for one or two IDT electrodes 7. When plural element covers 20 are formed in this way, damage of SAW duplexer 1 can be effectively suppressed as compared with the case where one element cover 20 is disposed so as to cover all IDT electrodes 7.

Namely, when plural element covers 20 are formed, cavities 16 are partitioned, and partition walls 19 shown in FIG. 9 are formed between plural cavities 16. Partition walls 19 function as struts, and it is possible to disperse an external stress. Therefore, breakage of component substrate 6 or component cover 9 and element covers 20 can be suppressed. Partition walls 19 may be separately formed in an arbitral manner in cavities 16 by a resin or the like.

Plural cavities 16 may be formed completely separately, or alternatively adjacent cavities 16 may be partly coupled to each other by a tunnel-like communication path (not particularly shown). In the case where communication paths are disposed in this way, when an excess external pressure is applied to a part of cavities 16, the external pressure can be dispersed to other cavities 16 through communication paths. As a result, the strength of the electronic component package against an external pressure can be improved.

In Embodiment 2, because of the reduced height of the electronic component, component cover 9 is thinner than component substrate 6. Therefore, component cover 9 is particularly susceptible to break, and, in accordance with damage of component cover 9, also element covers 20 are susceptible to be damaged. Therefore, the strength of component cover 9 must be improved, and hence the above-described configuration is requested.

Embodiment 3

Hereinafter, Embodiment 3 of the invention will be described with reference to the figures.

Figure 13:
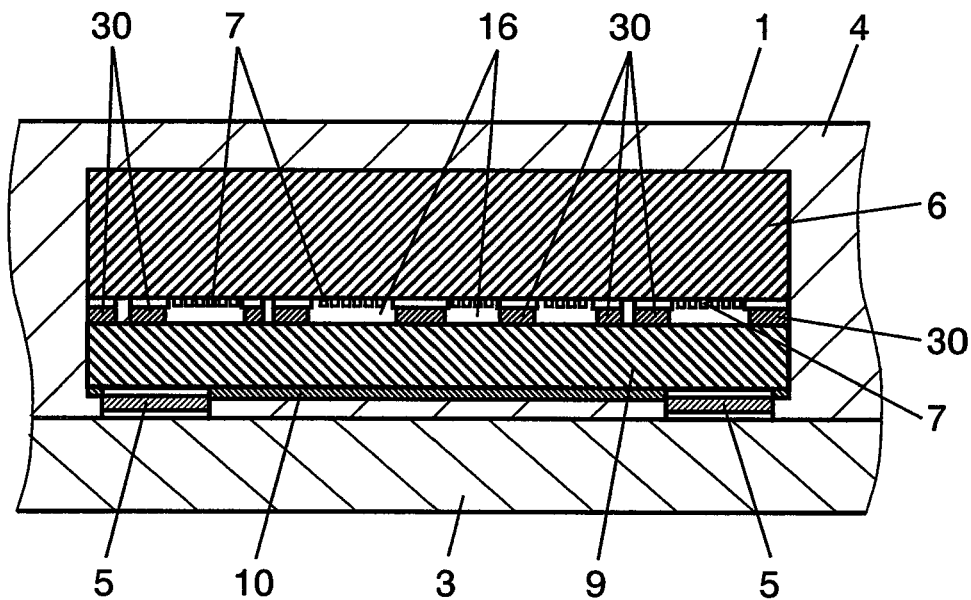
FIG. 13 is a sectional view of an electronic component package of Embodiment 3.

Embodiment 3 is mainly different from above-described Embodiment 1 in that, in order to form cavities 16, bonding portion 30 is disposed in the outer periphery of IDT electrodes 7 functioning as elements as shown in FIG. 13, component substrate 6 and component cover 9 are joined with each other via bonding portion 30, and the portion surrounded by bonding portion 30 is used as cavities 16. The other similar configurations are described with using the same reference numerals, and their description is simplified.

Also in the electronic component package of Embodiment 3, as shown in FIG. 1, it is structured so that SAW duplexer 1 is mounted together with other electronic components 2a to 2c on mounting substrate 3, and covered by mold resin 4.

As shown in a sectional view of FIG. 13, SAW duplexer 1 constituting the electronic component package includes: component substrate 6; IDT electrodes 7 which are plural elements formed on the lower face (the face that is in the lower side in FIGS. 13, 15A to 15F, and 16A to 16G, and the same shall apply to the description of Embodiment 3) of component substrate 6; and component cover 9 which covers the lower face of component substrate 6. Resin-made protective member 10 is disposed on the lower face of component cover 9. In the same manner as FIG. 8 of above-described Embodiment 1, external electrodes 5 indicate electrodes which are to be joined with ground terminal 12, reception terminal 13, antenna terminal 14, and transmission terminal 15 of SAW duplexer 1 shown in FIG. 17, and which are disposed on mounting substrate 3.

Bonding portion 30 is disposed between component cover 9 and IDT electrodes 7. When component cover 9 and component substrate 6 are joined with each other, cavities 16 are formed by the thickness of bonding portion 30. Protective member 10 which is lower in elastic modulus than mold resin 4, i.e., soft is disposed on the lower face of component cover 9. Bonding portion 30 is configured by joining first bonding portion 30a (shown in FIGS. 15D to 15F) disposed on the side of component substrate 6 with second bonding portion 30b (shown in FIGS. 16C to 16F) disposed on the side of component cover 9.

Hereinafter, a method of producing the electronic component package of Embodiment 3 will be described with reference to FIGS. 15A to 15F and 16A to 16G. FIGS. 15A to 15F and 16A to 16G are views showing steps of producing SAW duplexer 1, but, contrary to above-described FIGS. 11A to 11F and 12A to 12F, indicate the same vertical direction as FIGS. 1 and 2 showing the mounted state of SAW duplexer 1.

Figure 14:
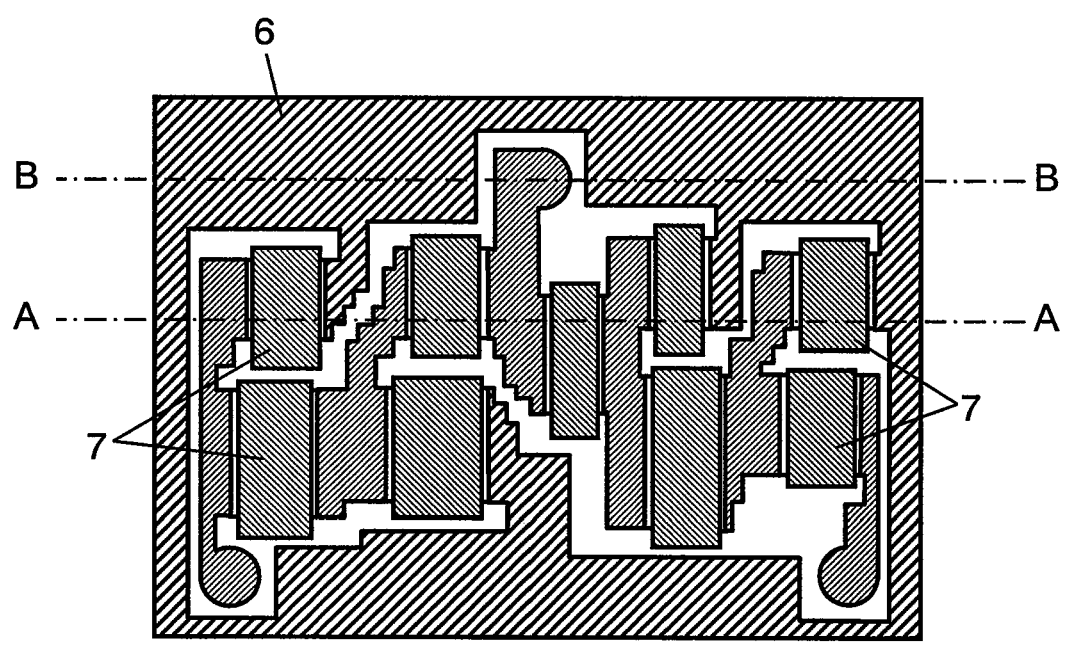
FIG. 14 is a bottom view of a component substrate constituting an electronic component package of Embodiment 4.
Figure 15A:
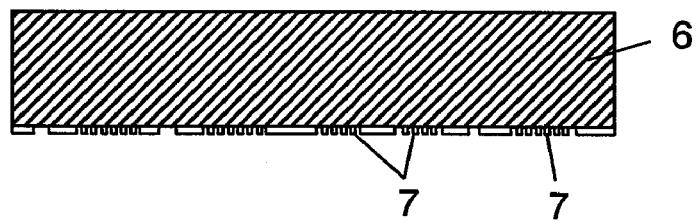
FIG. 15A is a first view showing a production step of a SAW duplexer in Embodiment 3.

First, as shown in FIG. 15A, aluminum is sputter deposited on the entire lower face of component substrate 6, and then, as shown in FIG. 14, an electrode pattern for IDT electrodes 7 and the like is formed by a dry etching process.

Figure 15B:
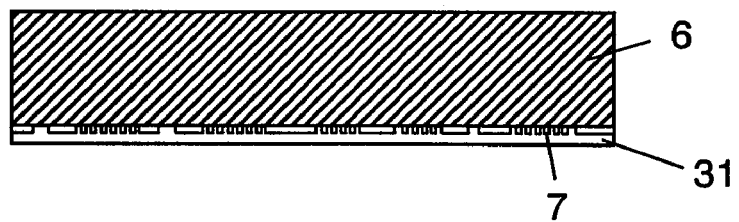
FIG. 15B is a second view showing the production step of the duplexer in Embodiment 3.
Figure 15C:
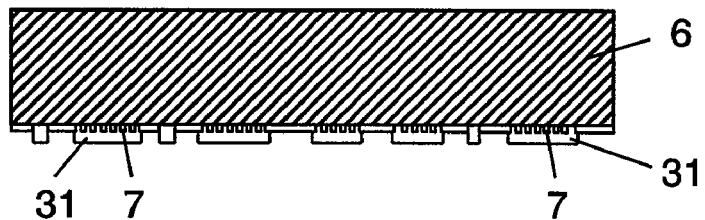
FIG. 15C is a third view showing the production step of the duplexer in Embodiment 3.

Next, as shown in FIG. 15B, resist 31 is applied onto the entire lower face of component substrate 6. Then, as shown in FIG. 15C, electrode portions to be connected with reception terminal 13, antenna terminal 14, and transmission terminal 15, and ground terminal 12 of FIG. 17, and an outer peripheral region of component substrate 6 surrounding all IDT electrodes 7 in FIG. 14 are patterned so as to be exposed. This is performed in order that, in the next step, aluminum is prevented from being deposited to the vicinities of IDT electrodes 7, and vibration spaces for IDT electrodes 7 are sufficiently ensured.

Figure 15D:
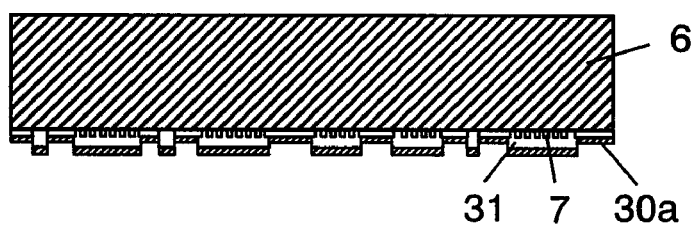
FIG. 15D is a fourth view showing the production step of the duplexer in Embodiment 3.
Figure 15E:
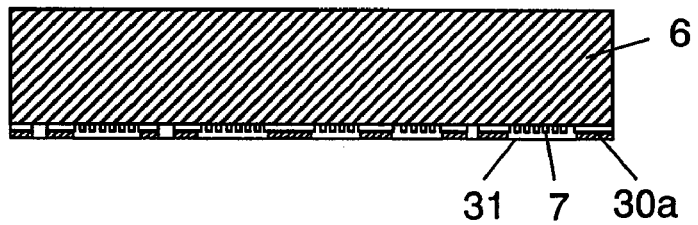
FIG. 15E is a fifth view showing the production step of the duplexer in Embodiment 3.

As shown in FIG. 15D, aluminum is deposited on the entire surface of patterned resist 31, and first bonding portion 30a is disposed in the exposed portion. Thereafter, as shown in FIG. 15E, polishing is performed from the lower side, and the level is aligned with the height of first bonding portion 30a. At this time, because the surface after deposition is highly uneven, also the lower face of first bonding portion 30a is preferably slightly polished so that the surface is smoothened. This is performed in order to enhance the adhesiveness with respect to component cover 9 which will be described later.

Figure 15F:
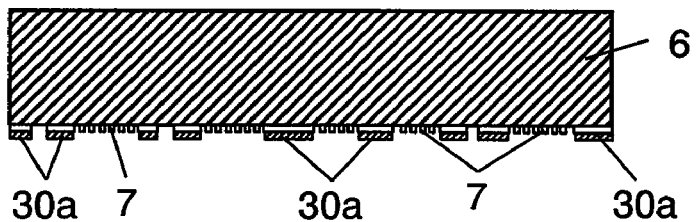
FIG. 15F is a sixth view showing the production step of the duplexer in Embodiment 3.

Next, component substrate 6 is immersed in a stripper solution for resist 31 to dissolve resist 31. Then, as shown in FIG. 15F, first bonding portion 30a can be formed so as to be slightly higher in level than IDT electrodes 7.

By contrast, in order to protect IDT electrodes 7 from corrosion due to oxidation or moisture, component cover 9 made of silicon is disposed on the side of the lower face of component substrate 6 as shown in FIG. 13. A method of producing component cover 9 will be described with reference to FIGS. 16A to 16G.

Figure 16A:
FIG. 16A is a seventh view showing the production step of the duplexer in Embodiment 3.
Figure 16B:
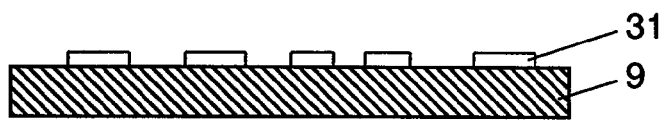
FIG. 16B is an eighth view showing the production step of the duplexer in Embodiment 3.
Figure 16C:
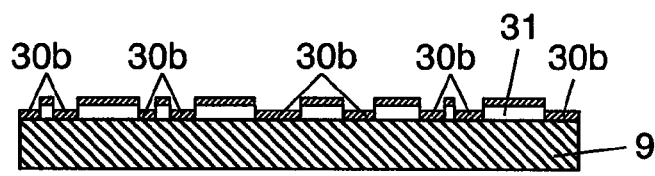
FIG. 16C is a ninth view showing the production step of the duplexer in Embodiment 3.

First, resist 31 is applied to the entire upper face of component cover 9 as shown in FIG. 16A, and patterned so that resist 31 remains in a portion other than a portion to be joined with first bonding portion 30a as shown in FIG. 16B. Thereafter, aluminum serving as second bonding portion 30b is deposited to the entire surface of component cover 9 as shown in FIG. 16C.

Figure 16D:
FIG. 16D is a tenth view showing the production step of the duplexer in Embodiment 3.
Figure 16E:
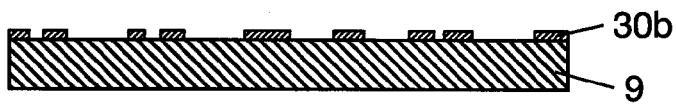
FIG. 16E is an eleventh view showing the production step of the duplexer in Embodiment 3.

Next, as shown in FIG. 16D, the surface of component cover 9 is polished, and the level is aligned with the height of second bonding portion 30b. At this time, in the same manner as first bonding portion 30a, preferably, also the upper face of second bonding portion 30b is slightly polished so that the surface is smoothened. Thereafter, component cover 9 is immersed in a stripper solution for resist 31 to dissolve resist 31, thereby completing component cover 9 such as shown in FIG. 16E.

Next, a method of joining component cover 9 with component substrate 6 will be described.

Figure 16F:
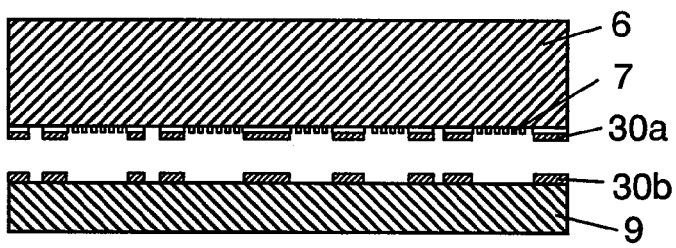
FIG. 16F is a twelfth view showing the production step of the duplexer in Embodiment 3.
Figure 16G:
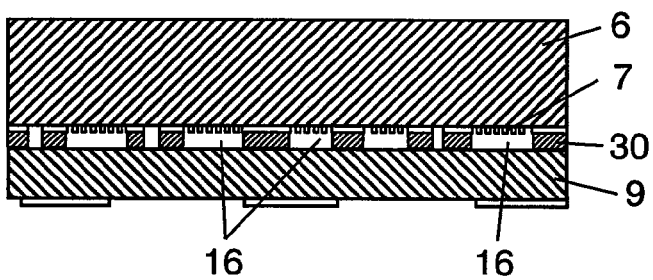
FIG. 16G is a thirteenth view showing the production step of the duplexer in Embodiment 3.

First, as shown in FIG. 16F, positioning is performed so that first bonding portion 30a disposed on the lower face of component substrate 6 is joined with second bonding portion 30b disposed on the upper face of component cover 9. Next, junction faces of the first bonding portion 30a and second bonding portion 30b are cleaned by plasma treatment. Thereafter, a pressure is lightly applied while heating to 200° C., and first bonding portion 30a and second bonding portion 30b are directly interatomically bonded together to form bonding portion 30 as shown in FIG. 16G.

Figure 17:
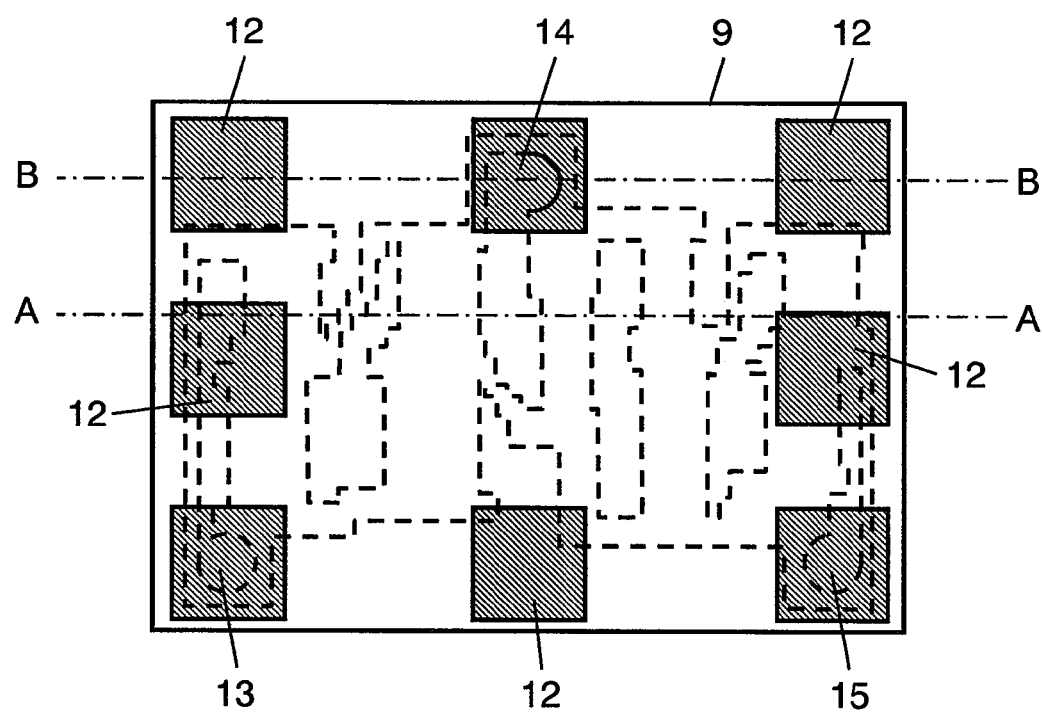
FIG. 17 is a bottom view of a component cover in Embodiment 3.
Figure 18:
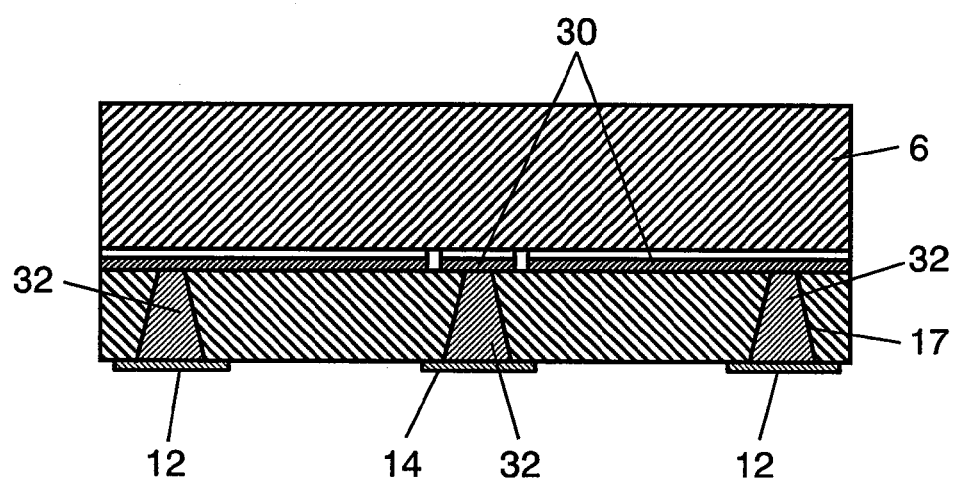
FIG. 18 is a sectional view of the SAW duplexer of Embodiment 3.
Figure 19:
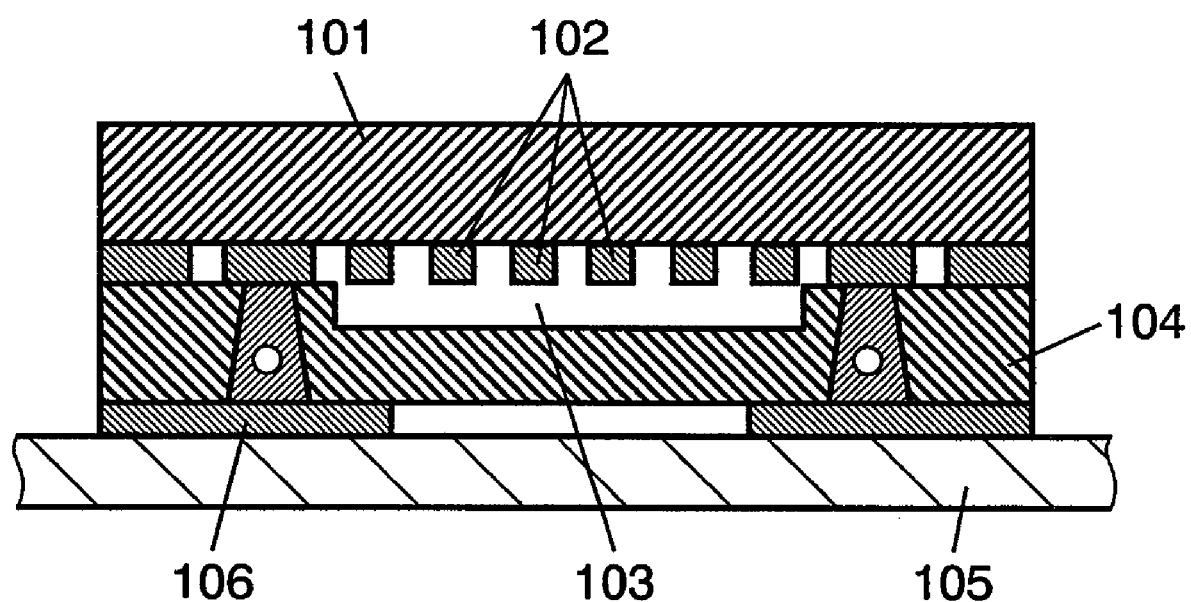
FIG. 19 is a sectional view of a conventional electronic component package.

Next, as shown in FIG. 18, through holes 17 for connecting the electrodes (ground terminal 12, reception terminal 13, antenna terminal 14, and transmission terminal 15 in FIGS. 17 and 18, and, however, only ground terminal 12 and antenna terminal 14 are shown in FIG. 18) disposed on the lower face of component cover 9, with the electrodes disposed on component substrate 6 are formed by a dry etching process. FIG. 18 shows a section taken along B-B in FIG. 17. Thereafter, Ti, Ni, and Au are sequentially deposited on the insides of through holes 17, and solder is printed to the interiors of the deposition films to fill them, thereby forming external terminal connecting portions 32.

Next, as shown in FIG. 13, resin-made protective member 10 is disposed on all faces excluding the portions where the electrodes to be joined with external electrodes 5 are placed, in the lower face of component cover 9. Protective member 10 is formed by performing printing or the like of a rubber modified flexible resin in which rubber such as silicone rubber is added to an epoxy resin or a polyimide resin. Thereafter, as shown in FIG. 17, the electrodes to be joined with external electrodes 5, i.e., ground terminal 12, reception terminal 13, antenna terminal 14, and transmission terminal 15 in FIGS. 7 and 18 are placed in the hatched positions in the lower face of component cover 9, thereby completing SAW duplexer 1.

Finally, a step of covering SAW duplexer 1 mounted on mounting substrate 3 with mold resin 4 to package the duplexer as shown in FIG. 1 will be described.

First, a complex electronic component in which SAW duplexer 1 and other electronic components 2a to 2c are mounted is placed in molds. Next, heated mold resin 4 is injected into the molds, and then cooled to be molded. In Embodiment 3, an epoxy resin in which a filler is dispersed was used as mold resin 4, and injection conditions of mold resin 4 were set so that the resin temperature is 175° C. and the injection pressure is 50 to 100 atm. As the filler of mold resin 4, silicon oxide was used, and its mixing rate was about 80 to 90 wt %.

According to the configuration, the strength of the electronic component package against an external pressure in the process using mold resin 4 is enhanced, and the electronic component can be prevented from being damaged. The reason of this phenomenon will be described.

When the space between component cover 9 and mounting substrate 3 is filled with mold resin 4 as shown in FIG. 13, a pressure which is very large, and which is upward directed is applied to component cover 9. Since resin-made protective member 10 is lower in elastic modulus than mold resin 4, i.e., soft, however, the protective member is deformed when receiving the pressure from mold resin 4, to laterally disperse the pressure. Therefore, protective member 10 can buffer a stress which is applied to SAW duplexer 1 from the lower side of component cover 9.

When protective member 10 is disposed, the space between SAW duplexer 1 and mounting substrate 3 is made small, and the amount of mold resin 4 entering the space can be reduced. Therefore, a stress from mold resin 4 can be suppressed.

Protective member 10 is disposed on all portions excluding the places where reception terminal 13, antenna terminal 14, transmission terminal 15, and ground terminal 12 to be joined with external electrodes 5 are placed, from the lower face of component cover 9. Alternatively, the protective member may be disposed on a partial portion excluding at least portions joined with external electrodes 5, and opposed to cavities 16, whereby the same function and effect as described above can be obtained.

In Embodiment 3, bonding portion 30 exists between plural IDT electrodes 7, and functions as a partition wall which finely divides cavities 16. When an external pressure due to mold resin 4 and the like is applied from the upper and lower sides of SAW duplexer 1, the partition wall functions as a struts, and can disperse a stress. Therefore, the strength of the package of SAW duplexer 1 against an external pressure can be improved.

In Embodiment 3, because of the reduced height of the electronic components, component cover 9 is thinner than component substrate 6. Therefore, component cover 9 is particularly susceptible to break, and the strength of component cover 9 must be improved. Consequently, the above-described configuration and means are requested.

INDUSTRIAL APPLICABILITY

In the electronic component package of the invention, the strength of the electronic component package against an external pressure can be improved, and an electronic component can be prevented from being damaged. Therefore, the invention can be largely used in a step of a transfer molding process under high-pressure conditions. Therefore, the industrial applicability of the invention is very large.

The invention claimed is:
1. An electronic component package comprising: a mounting substrate; external electrodes placed on the mounting substrate; an electronic component mounted on the mounting substrate via the external electrodes; and a mold resin which covers the electronic component on the mounting substrate,
the electronic component having: a component substrate; elements which are placed on a face of the component substrate opposed to the mounting substrate; and a component cover which covers a side of the face of the component substrate opposed to the mounting substrate, the component cover having cavities in portions which are opposed to the elements, a protective member which is lower in elastic modulus than the mold resin being disposed in a face of the component cover opposed to the mounting substrate, the face excluding portions joined with the external electrodes, and being opposed to the cavities.

2. The electronic component package of claim 1 wherein the protective member is formed by a resin or rubber.

3. The electronic component package of claim 1 wherein recesses are disposed in portions opposed to the elements of the component substrate, and the cavities are formed by the recesses.

4. The electronic component package of claim 1 wherein the elements are covered by an element cover to form the cavities.

5. The electronic component package of claim 1 wherein a bonding portion is disposed in an outer periphery of the elements, the component substrate and the component cover are joined with each other via the bonding portion, and the cavities are formed in a portion surrounded by the bonding portion.

* * * * *

UNITED STATES PATENT AND TRADEMARK OFFICE
CERTIFICATE OF CORRECTION

PATENT NO. : 7,652,214 B2  Page 1 of 1
APPLICATION NO. : 11/575809
DATED : January 26, 2010
INVENTOR(S) : Takano et al.

It is certified that error appears in the above-identified patent and that said Letters Patent is hereby corrected as shown below:

On the Title Page, Item [86]:

"PCT No.:  PCT/JP2006/021638" should read --PCT No.:  PCT/JP2006/321638--.

Signed and Sealed this

Twenty-second Day of June, 2010

David J. Kappos
*Director of the United States Patent and Trademark Office*